United States Patent
Tepman et al.

[11] Patent Number: 5,803,977
[45] Date of Patent: Sep. 8, 1998

[54] APPARATUS FOR FULL WAFER DEPOSITION

[75] Inventors: Avi Tepman, Cupertino; Robert E. Davenport, San Jose, both of Calif.

[73] Assignee: Applied Materials, Inc., Santa Clara, Calif.

[21] Appl. No.: 567,601

[22] Filed: Dec. 5, 1995

Related U.S. Application Data

[63] Continuation-in-part of Ser. No. 461,575, Jun. 2, 1995, which is a continuation of Ser. No. 954,860, Sep. 30, 1992, abandoned.

[51] Int. Cl.⁶ .................................................. C23C 16/00
[52] U.S. Cl. .......................... 118/728; 118/715; 118/725
[58] Field of Search .................................. 118/725, 728, 118/715

[56] References Cited

U.S. PATENT DOCUMENTS

| | | | |
|---|---|---|---|
| 5,192,371 | 3/1993 | Shuto et al. | 118/728 |
| 5,228,501 | 7/1993 | Tepman et al. | 165/80.1 |
| 5,238,499 | 8/1993 | Van de Ven et al. | 118/724 |
| 5,370,739 | 12/1994 | Foster | 118/728 |
| 5,480,489 | 1/1996 | Hasegawa | 118/728 |
| 5,494,523 | 2/1996 | Steger | 118/728 |
| 5,589,224 | 12/1996 | Tepman | 118/728 |

FOREIGN PATENT DOCUMENTS

| | | | |
|---|---|---|---|
| 0 606 721 A1 | 7/1994 | European Pat. Off. | H01L 21/00 |
| 0 742 579 A2 | 11/1996 | European Pat. Off. | H01L 21/00 |

*Primary Examiner*—Richard Bueker
*Attorney, Agent, or Firm*—Thomason and Moser

[57] ABSTRACT

A readily removable deposition shield assembly for processing chambers such as chemical vapor deposition (CVD), ion implantation, or physical vapor deposition (PVD) or sputtering chambers, is disclosed. The shield assembly includes a shield member which is mounted to the chamber for easy removal, such as by screws, and defines a space along the periphery of the substrate support. A shield ring is inserted into the peripheral space and is thus mounted in removable fashion and is automatically centered about the substrate. The shield ring overlaps the cylindrical shield and a deposition ring. The deposition ring removably rests upon a flange extending from the outer periphery of a substrate support pedestal. Collectively, these components prevent deposition on the chamber and hardware outside the processing region.

26 Claims, 4 Drawing Sheets

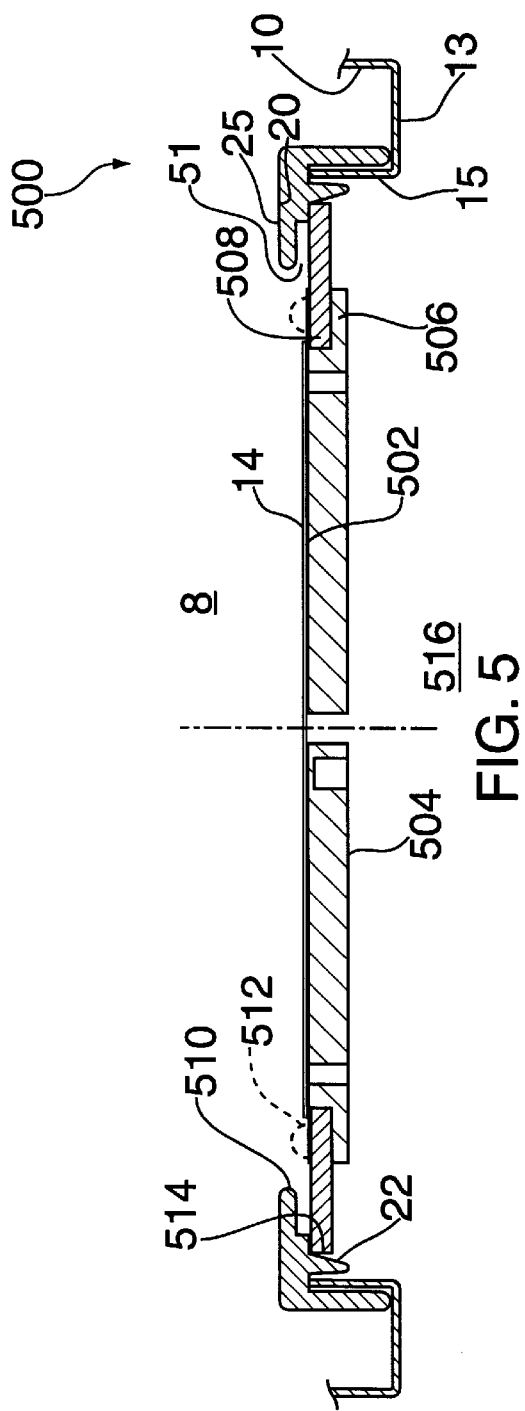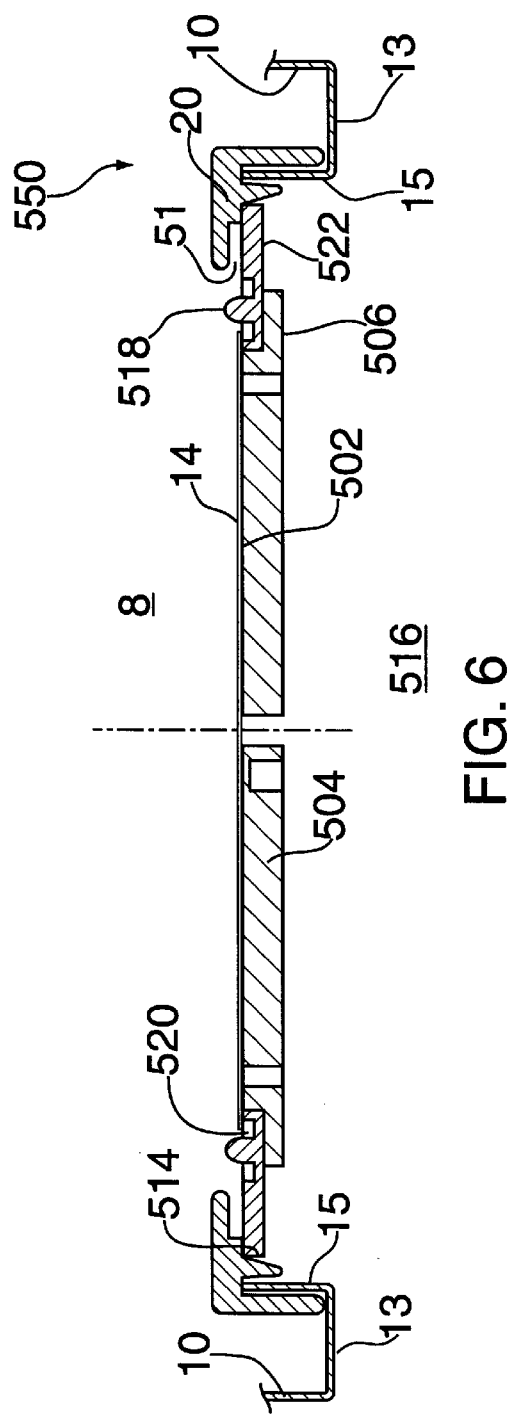

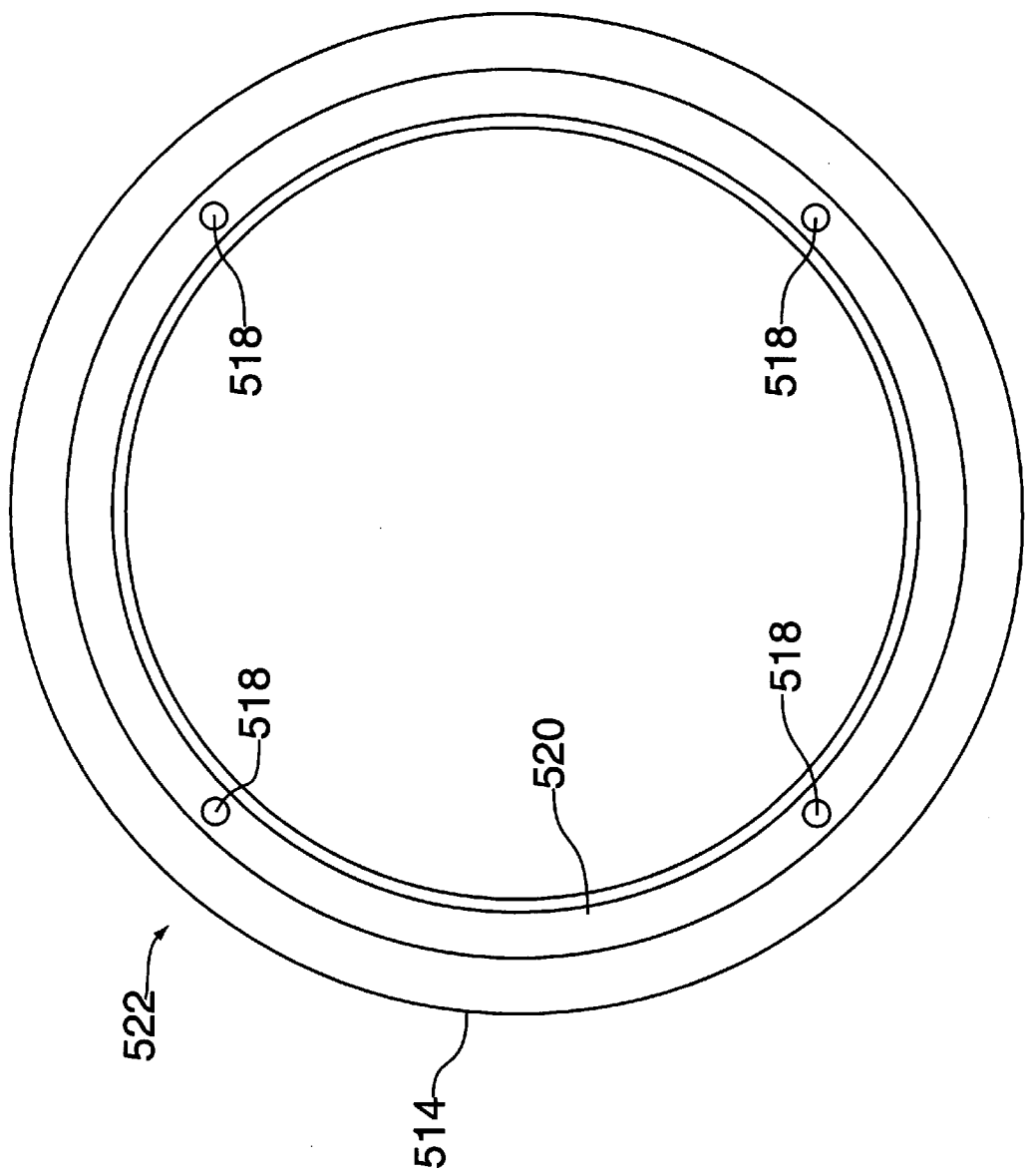

APPARATUS FOR FULL WAFER DEPOSITION

RELATED APPLICATIONS

This is a continuation-in-part of co-pending U.S. application Ser. No. 08/461,575, filed Jun. 2, 1995, which is a continuing application of U.S. application Ser. No. 07/954,860, filed Sep. 30, 1992, abandoned.

BACKGROUND OF THE INVENTION

1. Field of the Invention

This invention relates generally to deposition shields for processing chambers, including for example physical vapor deposition or sputtering chambers, chemical vapor deposition chambers and ion implantation chambers. More specifically, the invention relates to a removable deposition ring for facilitating full wafer deposition while protecting the wafer support pedestal from the deposition species.

2. Description of the Background Art

In deposition processes, species from a source such as a target, a gas inlet manifold and the like may deposit on exposed internal chamber surfaces, including the chamber walls and hardware. Shields are available which are designed to intercept such species. However, the presently available shields have not been successful in completely blocking unwanted deposition on these surfaces. Also, such shields may be difficult and/or time-consuming to replace, and require relatively frequent replacement. The use of automatic substrate exchange systems, with their attendant in-chamber movable components, increases the difficulty of attaining adequate shielding and easy replacement of these shields.

Therefore, there is a need in the art for shields that provide adequate shielding of chamber components as well as easy replacement.

SUMMARY OF THE INVENTION

The invention is a removable deposition ring that prevents the deposition species from being deposited upon the substrate support pedestal that supports the substrate (wafer) within a reaction chamber. The deposition ring of the present invention circumscribes the peripheral edge of the substrate support pedestal and is coaxially aligned with the center axis of the pedestal. The deposition ring rests upon a flange extending from the outer edge of the pedestal. The inner circumference of the deposition ring abuts the circumferential edge of the pedestal and the top surface of the deposition ring is substantially coplanar with the substrate support surface of the pedestal such that the deposition ring is, in essence, a radial extension of the substrate support surface of the pedestal. The outer edge of the deposition ring supports a shield or cover ring. The deposition ring is removable from the pedestal for cleaning and/or disposal.

The deposition ring may include substrate locating or centering means mounted about the periphery of the substrate. The centering means engages the peripheral edge of the substrate to center the substrate at a centrally located substrate mounting position upon the pedestal. The deposition ring also may include a groove or channel extending along the periphery of the substrate mounting position for allowing deposition on the deposition ring peripheral to the substrate without interfering with the substrate on the support surface of the pedestal. Preferably, when the groove is used, the centering means is a plurality of elongated pins formed at spaced locations along the groove.

Importantly, the deposition ring is effective and easily removed from the pedestal for cleaning and/or replacement. Features such as the peripheral groove increase the processing time between ring cleanings. In addition, other components operating in conjunction with the deposition ring, including the cover ring and a chamber shield, define a shielding assembly that is especially tailored to eliminate build-up of deposits that would interfere with support of the substrate. Uniquely, features such as a gap between the edge of the substrate and the support assembly permit the entire upper surface of the substrate to be available for deposition.

BRIEF DESCRIPTION OF THE DRAWING

The above and other aspects, features and advantages of the invention are described below with respect to the drawing, in which:

FIG. 5 is a schematic simplified partial vertical cross-sectional view of a shielded processing chamber incorporating an alternative embodiment of the present invention;

FIG. 6 is a schematic simplified partial vertical cross-sectional view of a shielded processing chamber incorporating an alternative embodiment of the present invention, where the deposition ring contains a peripheral groove and centering pins; and FIG. 7 is a top plan view of the deposition ring of FIG. 6.

DETAILED DESCRIPTION OF THE PREFERRED EMBODIMENT(S)

Figure 1:
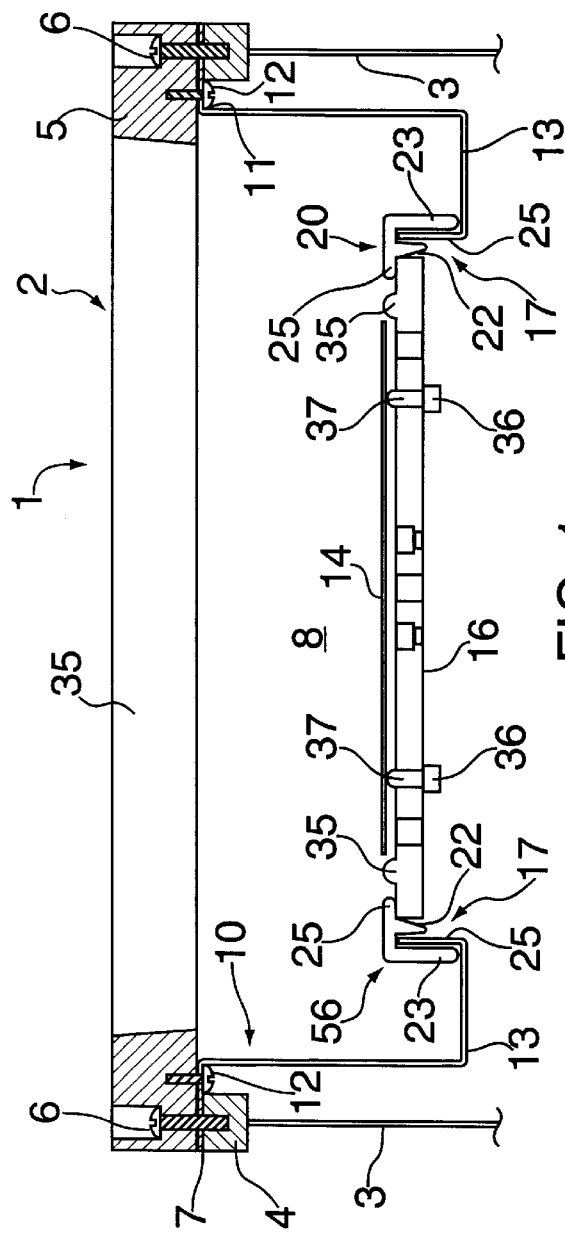
FIG. 1 is a schematic simplified partial vertical section view of a shielded processing chamber which embodies the present invention.

FIG. 1 is a simplified schematic drawing which illustrates an embodiment 1 of the invention incorporated in a deposition chamber. My invention effectively shields the chamber and internal hardware from deposition, yet affords easy removal of the shield components for cleaning or replacement. The invention also permits full wafer deposition, that is, deposition over the entire surface of a substrate such as a semiconductor wafer. The invention is applicable to deposition chambers generally, including for example physical vapor deposition (PVD) or sputtering chambers, chemical vapor deposition (CVD) chambers, and ion implant chambers.

By way of example, FIG. 1 illustrates a sputtering chamber 2. The substrate 14 is positioned adjacent chamber processing region 8 on a support member 16 such as a susceptor or a pedestal. By way of example, the diameter of the support member 16 is greater than that of the substrate 14. In the exemplary arrangement, the support member 16 may be attached, as by a plurality of screws 9—9, FIG. 2, to a conventional vertically movable elevator system 18. (Please note, hardware such as gas inlet manifolds and/or sputtering targets is omitted for clarity.)

The exemplary sputter chamber 2 includes a cylindrical chamber wall 3 and a support ring 4 which is mounted to the top of the chamber wall, as by welding. An adaptor plate 5 which may form the top wall of the chamber 2 is attached to the support ring 4 by a plurality of screws 6—6. 0-ring 7 provides an hermetic seal. A deposition source (not shown) such as sputtering target assembly or a gas inlet manifold may be mounted in recess 35 and sealed from the ambient. A wall-like cylindrical shield member 10 is mounted to the support ring 4. That is, the cylindrical shield 10 has an outwardly extending upper lip 11 which is attached to the bottom of the adaptor plate 5 by a plurality of screws 12—12. The cylindrical shape of the shield member 10 is illustrative of a shield member that conforms to the shape of the chamber and/or the substrate. The shield member 10 may, of course, be of any shape. A flange 15 extending upward from annular bottom wall 13 of the shield member 10 surrounds the periphery of the substrate support member 16, leaving a space 17 between the shield flange 15 and the support 16.

The deposition shield assembly 1 also includes an annular shield ring 20 having an inner diameter which is selected so that the ring fits peripherally over the support 16 adjacent to the substrate 14. The ring 20 comprises a downward extending, tapered centering flange 22 which fits into the opening 17 between the flange 15 and the side edge of the substrate support 16, and a second, outer flange 23 which is generally parallel to flange 22. The shield ring 20 is mounted in removable fashion at the periphery of the substrate 14 by seating the two flanges over the mating flange 15 of the cylindrical shield means 10, with the tapered centering flange 22 extending into the opening 17. The shield ring 20 also comprises a raised, inward-extending roof 25 which protects the periphery of the substrate from species traveling inwardly, for example, along direction 56, and prevents deposition on the surfaces on which the shield ring 20 rests and on the associated ring-surface interfaces.

As mentioned, the shield assembly uniquely combines full effective shielding of the chamber with easy removal. Specifically, effective shielding action is provided by the cylindrical shield member 10, the relatively wide substrate support member 16 (that is, the support which extends laterally beyond the substrate) and the shield ring 20, which overlaps both the substrate support and the inward-extending bottom section of the shield member 10. These overlapping components combine to isolate the processing region of the chamber 8 from the rest of the chamber interior and shield the rest of the chamber (for example, chamber walls such as 3 and the internal chamber hardware such as the movable elevator 18 beneath the support member 16) from deposition. The shield components are easily removed, by removing the adaptor plate mounting means such as the screws 6—6 and lifting, as a unit, the adaptor plate 5; the shield member 10, which is attached to the adaptor plate; and the shield ring 20, which is supported in removable fashion on the shield member 10. The dual-function substrate support member and shield component 16 is then easily removed by removing the three mounting screws 9—9, FIG. 2. Alternatively, the shield ring 20 can be removed by simply lifting the ring out of the locating space 17, or the shield ring can be removed to permit removal of the substrate support member 16, if desired, without removing the shield 10. Obviously, the shield components are replaced for example by attaching the substrate support member 16 using screws 9—9, and inserting the shield unit and attaching the unit via screws 6—6.

Figure 4:
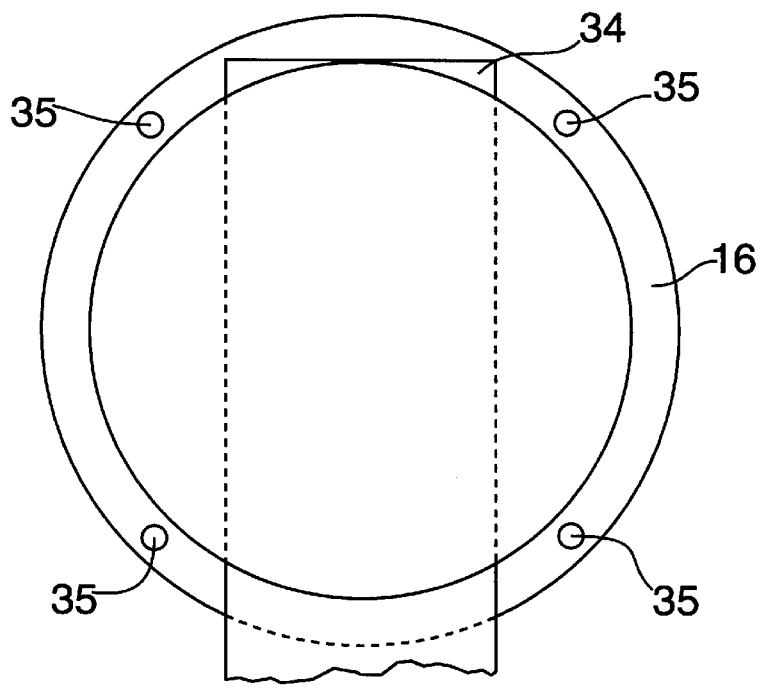
FIG. 4 is a simplified schematic representation of the relationship of the wafer, the wafer support member, the wafer centering or locating means, and a robot transfer blade.

In accordance with another aspect of the invention, substrate locating or centering means such as protrusions or bumps 35—35 (see FIG. 4 as well as FIG. 1) are formed in the upper surface of the substrate support member 16 peripheral to the mounting position of the substrate 14 for precisely centering the substrate on the support. As shown in FIG. 4, four alignment bumps 35—35 are positioned at 90° intervals in a rectangular array, to effect the positioning function 360° about the periphery of the wafer 14. The centering means limits lateral movement of the wafer 14 relative to the substrate support member 16; thereby, ensuring the wafer is positioned at the desired location on the substrate support member for processing as well as ensuring the wafer is in position on the support for pick-up by the robot blade 34. The centering function permits full wafer deposition, that is, deposition over the entire surface of a substrate such as wafer 14, without using edge clamps, or where clamps are not required. Preferably, the alignment bumps 35—35 are rounded (for example, hemispherical) to avoid sharp corners which can cause particles to flake off into the processing environment.

Figure 2:
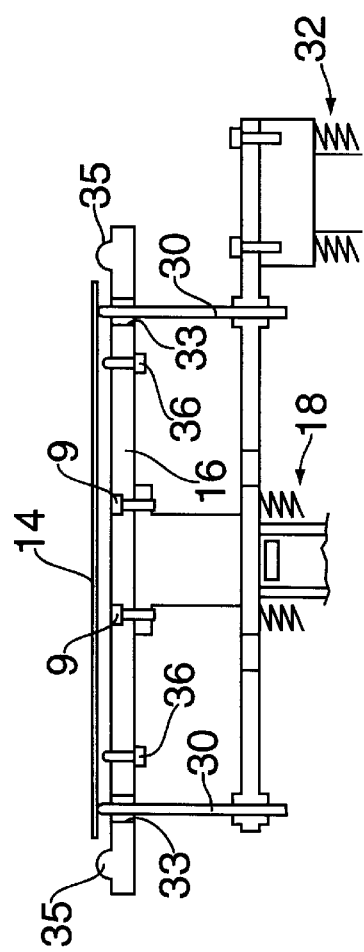
FIG. 2 is a schematic simplified partial vertical sectional view of an automatic substrate exchange system.

Referring to FIGS. 1, 2 and 4, in the illustrated chamber system 2, the substrate support member 16 is mounted to the elevator 18 for vertical movement relative to an arrangement of pins 30—30 which themselves are moved vertically by a second vertical lift or elevator mechanism 32. The coordinated vertical movement of the substrate support member 16 and the substrate support pins 30—30 (which extend through holes 33—33 in the substrate support) in combination with the coordinated horizontal movement of a substrate transfer blade 34, FIG. 4, transfers substrates into and out of the chamber and onto and off the substrate support member 16. In addition, vertical movement of the substrate support member 16 by elevator 18 permits precise positioning of the substrate relative to the source such as a gas inlet manifold and/or a sputtering target. This type of automatic substrate exchange and positioning system is known in the art and is described for example in commonly assigned U.S. Pat. No. 4,951,601 issued Aug. 28, 1990 to inventors Maydan et al.

Despite the complications provided by the above-described moving parts, the deposition shield assembly 1 provides effective shielding against unwanted deposition and is readily removable and replaceable. Please note, although the illustrated cylindrical shield assembly 1 is configured for a circular semiconductor wafer, other shield configurations may be used as required to conform to other substrate and chamber configurations.

In accordance with another aspect of the invention, a spacer means, in the form of a plurality of pins 36—36 threaded through mating holes 37—37 in the substrate support member 16, supports the substrate 14 just above the upper surface of that member. In providing a small gap 50 (see FIG. 3) between the support member 16 and the wafer 14, the spacer means prevents material which deposits along the exposed periphery of the support member at the edge of the substrate from bonding to the substrate and from bonding the support member to the substrate. The spacer(s) thus facilitate full wafer deposition. The height of the pins 36—36 preferably provides a gap of about 0.5–1 millimeter between the substrate and its support member 16. A gap greater than about 1 millimeter may allow the deposited material to reach the backside of the substrate.

Figure 3:
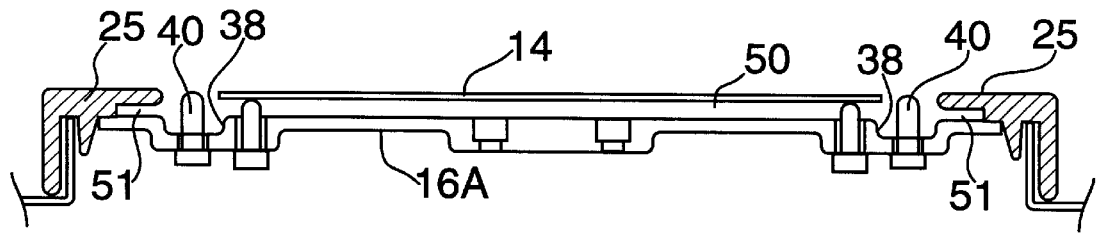
FIG. 3 illustrates an alternative embodiment of the shield arrangement depicted in FIG. 1.

FIG. 3 depicts an alternative shielded substrate support member 16A which is preferred for high rate deposition, typically of relatively low stress material such as aluminum and aluminum-containing compounds of other materials. Please note, typical processes may deposit about 1000 Angstroms of material per wafer, with the result that perhaps 5000 wafers can be processed before the support or pedestal 16 must be cleaned. Aluminum thickness, however, may be 10,000 Angstroms per wafer. Because of the possibility of backside deposition, the gap 50 cannot be increased sufficiently to accommodate this increased deposit thickness. Instead, a channel or groove 38 is formed in the substrate support member 16A along the periphery of the substrate 14. The groove 38 allows additional build-up of deposited material (relative to a planar configuration) on the support member 16A along the edge of the substrate 14 without the material sticking to the substrate and without interfering with the positioning and orientation of the substrate on the support.

In the FIG. 3 embodiment, the centering means is located in the groove and, thus, comprises elongated threaded centering pins 40—40 of adjustable length which are attached to the substrate support 16A via threaded holes, instead of the smaller (shorter) centering bumps or protrusions 35—35, FIG. 1. Also, gap 51 between the roof 25 and the substrate support beneath the roof prevents the roof from sticking to the support. In addition, the radial length of the inward extending roof prevents deposited material from reaching the surfaces upon which the roof is supported.

Useful material for the components of the shield assembly 1 include stainless steel, aluminum, titanium and copper. Stainless steel is a preferred material because it is relatively easy to clean. Aluminum or copper may be preferred when depositing materials such as tungsten which do not stick to stainless steel.

FIG. 4 is a simplified schematic drawing, not to scale, depicting the relationship of the wafer 14, the locating or centering means (35 or 40), the substrate support member 16 and the robot transfer blade 34. In the is illustrated embodiment, the centering means comprises four bumps 35—35 spaced at 90° intervals around the near-periphery of the wafer support member 16 for effecting secure positioning 360° around the substrate.

Although operation of the robot blade of the type contemplated here is well known, one mode of operation will be reviewed to ensure understanding of the cooperation among the various components. To position a wafer 14 on the support 16, the wafer is positioned on the robot blade 34 and the blade is inserted into the chamber, typically through a slit valve-controlled opening or other suitable opening (not shown) in the chamber wall, to position the wafer over the retracted (lowered) support 16 and pin array 30—30. The pins 30—30 are raised by elevator 32 relative to the substrate support member 16 to lift the substrate 14 off the robot blade 34. The robot blade is withdrawn and the elevator 32 and pins 30—30 are lowered relative to the substrate support member 16, thereby depositing the substrate onto the spacer support pins 36—36, with the substrate being centered by the locating means 35—35. In the illustrated embodiment, elevator 18 can be used to vary the vertical position of the support 16 and the substrate 14 relative to the processing region or the sputtering source or the gas inlet manifold, etc., to control the fabrication process.

Conversely, to remove the substrate 14 from the chamber after processing, the pins 30—30 are elevated through the holes 33—33 relative to the substrate support member 16, then the robot blade 34 is inserted between the substrate support member and the substrate to lift the substrate off the spacer support pins 36—36. Elevator 32 is actuated to lower the elevator pins 30—30, to deposit the substrate 14 on the robot blade 34 and the robot blade and the substrate are withdrawn from the chamber.

FIG. 5 depicts a cross-sectional view of an another embodiment of the inventive shield assembly 500. In this embodiment, the substrate support surface 502 of the pedestal 504 does not extend beyond the periphery of the substrate 14. The pedestal has a peripheral flange 506 extending radially from the outer edge of the pedestal. This flange 506 has a top surface that supports a deposition ring 508. The deposition ring circumscribes the substrate support pedestal such that the inner edge of the deposition ring abuts the outer edge of the pedestal, while the support surface 502 of the pedestal 504 is coplanar with a top surface 510 of the deposition ring 506. In essence, the deposition ring is a removable extension of the support surface of the pedestal. In its simplest form, the deposition ring 508 is an annular ring having a rectangular cross section. Alternatively, the ring could include the centering means, e.g., bumps 512, which serve the same purpose as the bumps 35 of FIG. 1.

More specifically, the deposition shield assembly 500 is formed of an annular cover (or shield) ring 20 having an inner diameter which is selected so that the cover ring fits peripherally over the outer diameter of the deposition ring which circumscribes the outer edge of the pedestal 504. The annular cover (or shield) ring 20, as described above with respect to FIGS. 1 and 3, comprises a downward extending tapered center flange 22 which fits into an opening between the shield member flange 15 and the outer edge 514 of the deposition ring. The shield member flange, which generally is parallel to the cover ring flange, the cover ring is mounted in a removable fashion at the periphery of the shield member by seating the two flanges with the tapered centering flange extending into the opening between the deposition ring and the shield member flange. The cover ring also comprises a raised, inward extending roof 25 which prevents deposition on the surfaces on which the cover ring rests. Additionally, a gap 51 between the roof 25 of the cover ring 20 and the top surface 510 of the deposition ring 508 beneath the roof prevents the roof from sticking to the deposition ring. In addition, the radial length of the inward extending roof prevents deposited material from reaching the surfaces upon which the roof is supported on the deposition ring.

To support the deposition ring 508, the peripheral edge the pedestal is adapted to include a support flange 506 radially extending from the entire circumference of the pedestal. The annular deposition ring rests on the support flange and extends from the periphery of the pedestal 504 to the cover ring 20. As such, the outer peripheral edge 514 of the deposition ring 508 supports the cover ring 20. The surface 502 of the pedestal which supports the substrate has a diameter that is approximately equivalent to the diameter of the substrate 14. Preferably, this support surface diameter may be slightly smaller than the substrate diameter, such that, when a substrate is positioned on the support pedestal, no portion of the pedestal surface will be exposed to the deposition species. As such, the pedestal surface is protected from such deposition.

The shield assembly 500 uniquely combines full effective shielding of the chamber with easy removal. Specifically, effective shielding action is provided by the cylindrical shield member 10, the deposition ring 508 and the cover ring 20 which overlaps both the deposition ring and the inward extending bottom section of the shield member. These overlapping components combine to isolate the processing region 8 of the chamber from the remainder 516 of the chamber interior and shield the remainder of the chamber (for example, chamber walls and the internal chamber hardware, such as the moveable elevator that generally lies beneath the substrate support member) from deposition. The shield assembly components are easily removed by removing the adaptor plate mounting means, such as the screws, and lifting out as a single unit the adaptor plate; the shield member, which is attached to the adaptor plate; and the cover ring which is supported in removable fashion on the shield member. The deposition ring is then easily removed from the periphery of the pedestal. Alternatively, the shield ring and the deposition ring can be removed by simply lifting the rings out of the locating space.

In accordance with another aspect of the invention, substrate locating or centering means 512, such protrusion, bumps, or pins are formed upon the upper surface 510 of the deposition ring 508 peripheral to the mounting position of the substrate upon the pedestal surface. The centering means precisely centers the substrate on the substrate support. These bumps 512 function in the same manner as the bumps 35 of FIG. 1 and 2.

More specifically, four alignment bumps 512—512 are positioned at 90 degree intervals in a rectangular array to effect the positioning function 360 degrees about the periphery of the substrate 14. The centering means limits lateral movement of the substrate relative to the substrate support pedestal 504. As such, the centering means insures the substrate is positioned at the desired location on the substrate support pedestal for processing and insures the substrate is in a position on the pedestal for pick up by the robot blade (not shown). The locating function permits full substrate deposition, i.e., deposition over the entire surface of a substrate. Preferably the alignment bumps are rounded at their apexes to avoid sharp corners which can cause particles to flake off into the processing environment.

In a typical processing environment, it is desirable to process a large number of wafers before having to replace or clean the deposition ring and the cover ring. Such a replacement becomes necessary when the build-up of deposition materials on the deposition ring begins to interfere with placement of the substrates on the pedestal, such that the substrates would begin to stick to the material deposited on the deposition ring.

FIGS. 6 and 7 depict an alternative embodiment of the invention that accommodates the repetitive deposition of relatively thick layers of material. This embodiment of the shield assembly 550 contains a deposition ring 522 having a channel or groove 520 proximate the periphery of its inside diameter. This groove permits additional build-up of deposited material relative to the planar configuration on the support along the edge of the substrate 14 without the material sticking to the substrate and without interfering the positioning and the orientation of the substrate on the pedestal 504. The centering means is located in the groove and thus comprises elongated centering pins 518. More specifically, four alignment pins 518—518 are positioned at 90 degree intervals in a rectangular array to effect the positioning function 360 degrees about the periphery of the substrate 14.

Useful materials for the components of the various shield assembly embodiments include stainless steel, aluminum, titanium, and copper. Stainless steel is a preferred material because it is relatively easy to clean. Aluminum or copper may be preferred when using deposition materials, such as tungsten, which do not adhere to stainless steel.

Based upon the above disclosure of preferred and alternative embodiments of the invention, those of usual skill in the art will readily derive alternatives and implement modifications which are equivalent to the invention and within the scope of the claims of this patent document.

What is claimed is:

1. A substrate support apparatus comprising:
    a pedestal having a support surface for supporting a substrate and having a flange extending from the outer edge of the pedestal;
    a deposition ring, circumscribing said support surface and removably supported by said flange, for shielding said pedestal wherein said deposition ring contains a centering portion, located proximate to said support surface, for centering a substrate upon the support surface as the substrate is placed upon the Pedestal.

2. The substrate support apparatus of claim 1 wherein said deposition ring is annular and has a rectangular cross-section.

3. The substrate support apparatus of claim 1 wherein the support surface has a diameter that is smaller than a diameter of a substrate.

4. The substrate support apparatus of claim 1 wherein said centering portion comprises a plurality of protrusions extending from a surface of said deposition ring.

5. The substrate support apparatus of claim 1 wherein said deposition ring further comprises an annular groove.

6. The substrate support apparatus of claim 5 wherein said centering portion is located proximate to said support surface and within said annular groove.

7. The substrate support apparatus of claim 6 wherein said centering portion comprises a plurality of elongated pins extending from a bottom surface of said groove.

8. The substrate support of claim 1 wherein a top surface of said deposition ring is substantially coplanar with the support surface of the pedestal.

9. The substrate support apparatus of claim 1 wherein the support surface has a diameter that is substantially equivalent to a diameter of a substrate.

10. A deposition chamber shield assembly for restricting the deposition of materials on internal chamber components during processing of a substrate in the deposition chamber, comprising:
    a shield member extending circumferentially around the substrate to prevent deposition on the deposition chamber regions shielded by said shield member during processing of the substrate in the deposition chamber;
    a deposition ring circumscribing a pedestal having a support surface for supporting the substrate and having a flange extending from the outer edge of the pedestal, the deposition ring is removably supported by said flange, for shielding said pedestal; and
    a cover ring extending from the shield member over an outer edge of the deposition ring and terminating adjacent an edge of the substrate, said cover ring shielding an edge region of the deposition ring to prevent the passage of deposition materials past the edge of deposition ring.

11. The deposition chamber shield assembly of claim 10 wherein the support surface has a diameter that is smaller than a diameter of a substrate.

12. The deposition chamber shield assembly of claim 10 wherein said deposition ring is annular and has a rectangular cross-section.

13. The deposition chamber shield assembly of claim 10 wherein said deposition ring further comprises centering portion, located proximate to said support surface, for centering a substrate upon the support surface as the substrate is placed upon the pedestal.

14. The deposition chamber shield assembly of claim 13 wherein said centering portion comprises a plurality of protrusions extending from a surface of said deposition ring.

15. The deposition chamber shield assembly of claim 10 wherein said deposition ring further comprises an annular groove.

16. The deposition chamber shield assembly of claim 15 wherein said deposition ring further comprises centering portion, located proximate to said support surface and within said annular groove, for centering a substrate upon the support surface as the substrate is placed upon the pedestal.

17. The deposition chamber shield assembly of claim 16 wherein said centering portion comprises a plurality of elongated pins extending from a bottom surface of said annular groove.

18. The deposition chamber shield assembly of claim 10 wherein a top surface of said deposition ring is substantially coplanar with the support surface of the pedestal.

19. The deposition chamber shield assembly of claim 10 wherein the support surface has a diameter that is substantially equivalent to a diameter of the substrate.

20. A substrate support apparatus comprising:
   a pedestal having a support surface for supporting a substrate and having a flange extending from the outer edge of the pedestal; and
   a deposition ring circumscribing said support surface and removably supported by said flange, for shielding said pedestal wherein said deposition ring further comprises an annular groove which is aligned with an edge of the substrate such that the edge of the substrate does not contact the deposition ring.

21. The substrate support apparatus of claim 20 wherein the support surface has a diameter that is smaller than a diameter of a substrate.

22. The substrate support apparatus of claim 20 wherein said deposition ring is annular and has a rectangular cross-section.

23. The substrate support apparatus of claim 20 wherein said deposition ring further comprises centering portion, located proximate to said support surface, for centering a substrate upon the support surface as the substrate is placed upon the pedestal.

24. The substrate support apparatus of claim 23 wherein said centering portion comprises a plurality of protrusions extending from a surface of said deposition ring.

25. The substrate support apparatus of claim 23 wherein said centering portion comprises a plurality of elongated pins extending from a bottom surface of said groove.

26. The substrate support of claim 20 wherein a top surface of said deposition ring is substantially coplanar with the support surface of the pedestal.

* * * * *